(12) United States Patent
Herlihy

(10) Patent No.: US 6,403,934 B1
(45) Date of Patent: Jun. 11, 2002

(54) THERMSTRATE REFLOW PROCESS

(75) Inventor: David A. Herlihy, Ellicott City, MD (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 09/829,337

(22) Filed: Apr. 9, 2001

(51) Int. Cl.$^7$ .................................................. H05B 3/06
(52) U.S. Cl. ...................................................... 219/530
(58) Field of Search ................................. 219/530, 209, 219/540, 388; 343/853, 754, 700; 342/175

(56) References Cited

U.S. PATENT DOCUMENTS

| | | | | |
|---|---|---|---|---|
| 4,654,502 A | * | 3/1987 | Furtek | 219/85.13 |
| 4,771,929 A | * | 9/1988 | Bahr et al. | 228/102 |
| 5,039,841 A | * | 8/1991 | Kato et al. | 219/388 |
| 5,225,663 A | * | 7/1993 | Matsumura et al. | 219/543 |
| 5,607,609 A | * | 3/1997 | Sakuyama et al. | 219/388 |
| 5,770,835 A | * | 6/1998 | Sakuyama et al. | 219/388 |

* cited by examiner

*Primary Examiner*—Joseph Pelham
*Assistant Examiner*—Vinod D Patel

(57) ABSTRACT

A heat generating element, such as an electrical resistor, is located interiorally of a T/R module such as by being located on an inner surface of a heat sink member and on which a thermstrate member is attached. The heat generating member is connected to a pair of electrical contacts located on an outside surface of the T/R module, which when connected to an external source of DC potential generates sufficient heat to reflow the thermstrate when locked in place on the coldplate.

20 Claims, 1 Drawing Sheet

THERMSTRATE REFLOW PROCESS

BACKGROUND OF THE INVENTION

1. Field of the Invention

This invention relates generally to a method and apparatus for forming a cooling interface for an electronics package mounted to a cooling assembly and more particularly to a method and apparatus for heating a thermstrate element in the cooling interface of a high power RF microwave transmit/receive module during replacement in an active aperture of a radar system.

2. Description of Related Art

In a typical active aperture for a pulsed radar system, a large number of replaceable plug-in type high power transmit/receive (T/R) modules are arranged in a predetermined configuration and connected to an array of forwardly located radiator elements which collectively transmit and receive a beam of RF pulses to and form a target. Such a system is shown, for example, in U.S. Pat. No. 6,005,531, entitled "Antenna Assembly Including Dual Channel Microwave Transmit/Receive Modules", issued to John W. Cassen et al. on Dec. 21, 1999. The transmit/receive modules themselves are further shown and described in U.S. Pat. No. 6,1141,986, entitled "Dual Channel Microwave Transmit/ Receive Module For An Active Aperture Of A Radar System", issued to John W. Cassen et al. on Sep. 5, 2000.

These high power T/R modules, however, must be cooled efficiently to optimize overall transmit/receive module reliability. The method of providing an efficient thermal interface in the system of U.S. Pat. No. 6,005,531 is achieved by means of a thermstrate preform and miniature wedge lock assembly which holds the module tightly against an assembly including an elongated liquid coolant circulating coldplate connected to a coolant distribution manifold.

The medium used to fabricate a thermstrate is comprised of a paraffin-like coating typically 0.001 inches thick, applied to both sides of a 0.002 inch thick aluminum carrier. The function of the thermstrate is to fill surface imperfections and air gaps of the thermal interface, thereby increasing the cross section of thermal conduction path. To fill these voids, the wax must be liquefied or "reflowed". Liquefying the wax is a simple matter of heating the joint to the melting point of the wax while maintaining enough pressure to keep the wax in that joint. Once cured with the removal of heat, the resin is a thin, slightly bonded joint with a very low and attractive thermal impedance, on the order of 0.04° C. in$^2$/W.

The use of a thermstrate preform, however, presents a problem when a T/R module requires replacement. A typical antenna assembly such as shown in U.S. Pat. No. 6,005,531 is comprised of several hundred T/R modules. During assembly, a pre-cut thermstrate preform is tacked onto the external bottom surface of the modules' heat sink, whereupon they are installed into the array assembly while mating with assigned RF connectors. Once all of the required modules are in place, small wedgelocks are installed. These wedgelocks when torqued, clamp each T/R module to a liquid filled coldplate assembly. The preinstalled thermstrate is therefore clamped between the T/R module and its coldplate. The assembly is next subjected to a thermstrate reflow process which can be achieved, for example, by placing the entire antenna in an oven or heat the coolant fluid flowing in the coldplate to a specified value so as to melt the thermstrate. The latter method is usually the one preferred.

During normal usage, some of the T/R modules will inevitably fail or perform less than desired, thus requiring replacement. Removing a T/R module is a simple task. For example, wedgelocks are loosened around the module in question and it is pried away. The module is then disengaged from its RF connectors and removed from use.

To prepare the site of the removed module for a replacement T/R module, the site need only be cleaned of any residual wax buildup. A new module with thermstrate is then installed, engaged into its connectors, and clamped to the coldplate with the wedgelocks. To reflow the thermstrate for a single or handful of replacement modules, the above stated scenario outlined above must be repeated, e.g., heat the coolant fluid for the entire antenna. This task can be a very time consuming, cumbersome effort to reflow a small quantity of modules. It is to this task that the subject invention is directed.

SUMMARY

Accordingly, it is an object of the present invention to provide an improvement in the method of replacing a plug-in type T/R module in an antenna assembly.

It is a further object of the invention to provide an improvement in the reflow process of a thermstrate located on the T/R module when a T/R module is set in position against a coldplate.

In one aspect of the invention, it is directed to a method of optimizing the heat conduction path in a thermal interface between an electronics package and a mounting assembly which also provides cooling of the electronics package, comprising the steps of: locating an electrical heating element on or in the electronics package; locating a meltable interface member between the electronics package and the mounting assembly and which has a specified melting point upon the application of a predetermined amount of heat; applying electrical energy to the heating element so as to heat the member to the melting point for a predetermined time, causing material of the member to fill surface imperfections and air gaps in the thermal interface; and, thereafter curing the member by the removal of heat with a resulting interface bond being formed between the electronics package and the mounting assembly.

Another aspect of the invention is directed to apparatus for facilitating the mounting of an electronics package to a mounting assembly which includes a cooling capability and having a thermal interface therebetween including an interface member having a specified melting point which when melted, fills surface imperfections and air gaps between the electronics package and the mounting assembly, comprising: a heating element located in the electronics package for generating heat sufficient to melt said interface member on demand during initial assembly or replacement; and a pair of electrical contacts located on an outer surface of the electronics package for the connection of an external source of electrical energy to said interface member.

Further scope of applicability of the present invention will become apparent from the detailed description provided hereinafter. It should be understood, however, that the detailed description and specific example, while indicating the preferred method and embodiment of the invention, are given by way of illustration only, since various changes and modifications coming within the spirit and scope of the invention will become apparent to those skilled in the art from this detailed description.

BRIEF DESCRIPTION OF THE DRAWINGS

The present invention will become more fully understood when considered together with the accompanying drawings which are provided by way of illustration only, and thus are not meant to be limitative of the present invention, and wherein.

DETAILED DESCRIPTION OF THE INVENTION

Figure 1:
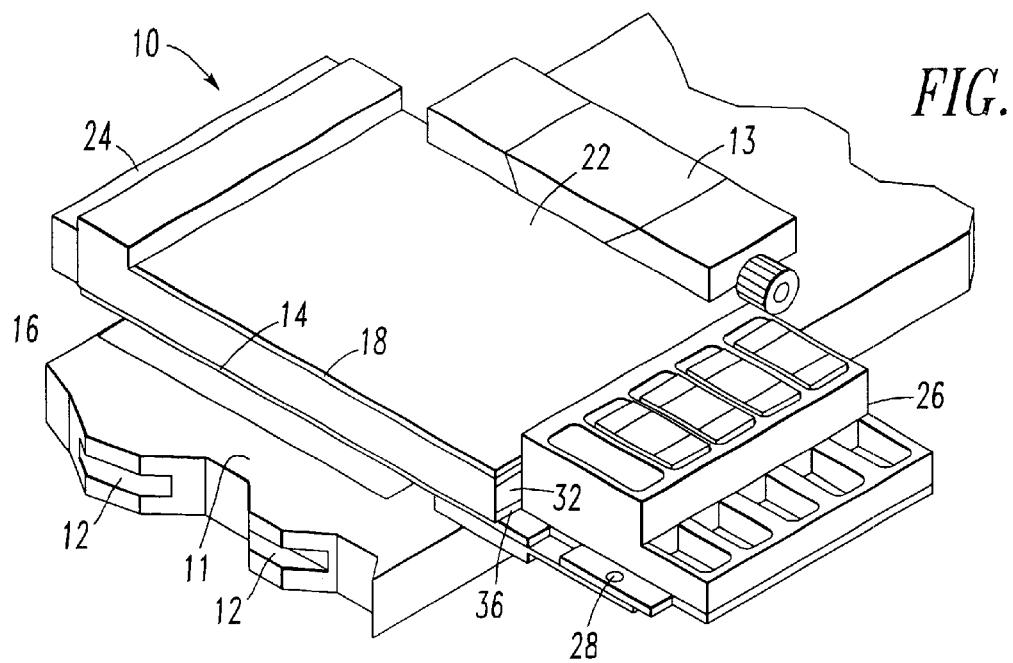
FIG. 1 is a perspective view of a transmit/receive (T/R) module mounted on a coldplate in accordance with the subject invention.

Referring now to the drawings wherein like reference numerals refer to like components throughout, reference is first made to FIG. 1 where reference numeral 10 denotes a transmit/receive (T/R) module of the type shown and described in the above-referenced U.S. Pat. No. 6,114,986. The T/R module, moreover, is mounted on a coldplate 11 in accordance with the teaching of U.S. Pat. No. 6,005,531. As shown in FIG. 1, the coldplate 11 includes a pair of liquid cooled passages 12. The T/R module 10 is held in place on the coldplate 11 by a wedgelock assembly 13. The T/R module 10 also includes a heat sink plate 14 on the underside thereof. A thermstrate preform element 15 is also shown in FIG. 1 located between the upper surface 16 of the coldplate 11 and the heat sink plate 14.

Figure 2:
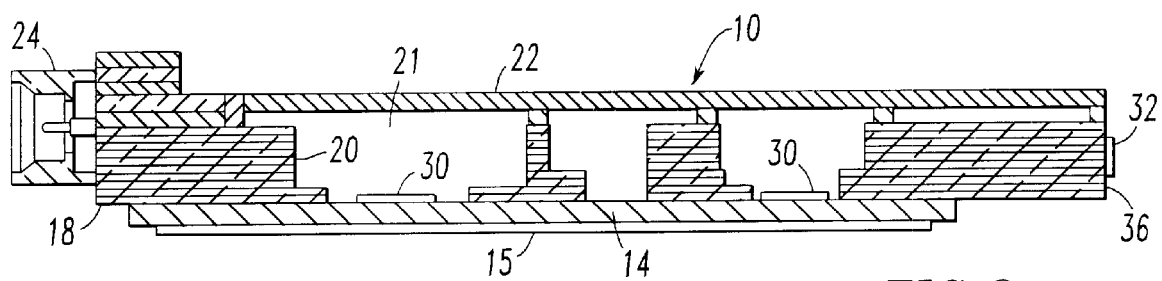
FIG. 2 is a longitudinal central cross-sectional view of a portion of the T/R module shown in FIG. 1.

Further as shown in FIG. 1, the T/R module 10 comprises a hermetically sealed package including an elongated relatively thin housing 18 consisting of a plurality of high temperature co-fired ceramic (HTCC) layers 20, as shown in FIG. 2, into which is formed a plurality of cavities 21 having one or more monolithic microwave integrated circuits (MMICs) and application specific integrated circuits (ASICs), not shown, located therein for implementing one or more separate and independent T/R channels. A metal cover 22 is placed and sealed over the top of the housing 18. A single multi-pin RF connector assembly 24, which can be easily plugged into the backside of an antenna array and is located on the front of the T/R module 10 and acts as an RF interface for all RF signals coupled to and from the module 10.

Further as shown in FIG. 1, the T/R module 10 also includes a capacitor bank sub-assembly 26 which is attached at the rear of the module housing 18 along with a DC/logic interface portion 28 wherein all other electrical connections between the module 10 and external apparatus supplying, for example, DC power and control signals, are attached to the underside of the housing 18 aft of the heat sink plate 14.

Figure 3:
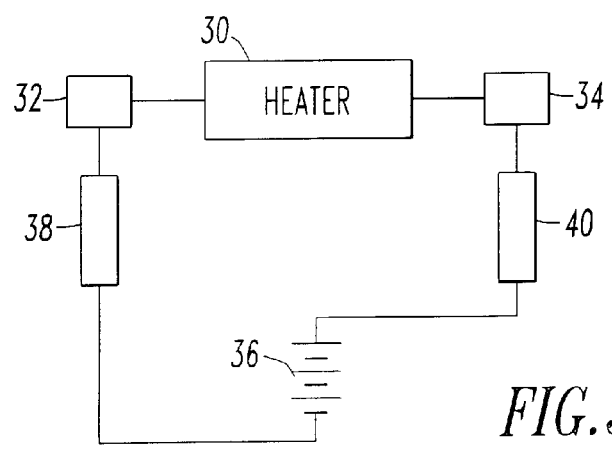
FIG. 3 is an electrical circuit diagram illustrating the principle of the subject invention.

In the present invention, one or more heat generating electrical components 30 which may be comprised of, for example, electrical resistor(s), are mounted to the inner surface of heat sink plate 4 on the inside of the housing 18 and connect to a pair of electrical contact elements 32 and 34 as shown in FIG. 3. The contract elements 32 and 34 comprise small metal pads which are mounted, for example, on the rear wall 36 extending across the back side of the housing 18. While not being so restricted, the resistor(s) 30 are used solely for thermstrate reflow purposes.

Accordingly, when an external DC source provided, for example, by a DC battery 36 and a pair of probes 38 and 40 is connected across the pads 32 and 34, the resistor(s) 30 generate a specified amount of heat which is transferred into the heat sink plate 14 and in doing so elevates the temperature of the termstrate preform 16 (FIG. 1) to its melting point. The resistor element(s) 30 are thus chosen so as to generate enough heat to reflow the wax medium of the thermstrate preform element 16. Following this, one or more wedgelocks 13 are set in place and tightened, the DC voltage is removed and the thermstate is allowed to cool. This completes the replacement process so that the radar system can be returned to operation.

Such an arrangement now facilitates a relatively easy field replacement of a T/R module 10 because nothing more is required than a portable, cordless voltage source, e.g. a DC battery, in lieu of a several hundred pound coolant pump which was required heretofore. The tool to reflow the thermstrate element 15 is nothing more than a simple hand-held battery powered probe 38, 40 that could be carried in a tool belt, for example, of a technician.

The foregoing detailed description merely illustrates the principles of the invention. It will thus be appreciated that those skilled in the art may be able to devise various arrangements which although not explicitly described or shown herein, nevertheless embody the principles of the invention and are thus within its spirit and scope.

What is claimed is:

1. A method of optimizing the heat conduction path in a thermal interface between an electronics package and a mounting assembly which also provides cooling of the electronics package, comprising the steps of:

locating an electrical heating element on or in the electronics package;

locating a meltable interface member between the electronics package and the mounting assembly and which has a specified melting point upon the application of a predetermined amount of heat;

applying electrical energy to the heating element so as to heat the member to the melting point for a predetermined time, causing material of the member to fill surface imperfections and air gaps in the thermal interface; and thereafter curing the member by the removal of heat Wit a resulting interface bond being formed between the electronics package and the mounting assembly.

2. A method according to claim 1 wherein said step of applying electrical energy comprises connecting an external source of voltage across the heating member.

3. A method according to claim 2 wherein said interface member comprises a carrier element having a paraffin-like coating applied to both sides thereof.

4. A method according to claim 3 wherein the carrier element has a thickness of about 0.002 in. and the paraffin-like coating has a thickness of about 0.001 in.

5. A method according to claim 3 wherein the heating member comprises an element having a predetermined electrical resistance.

6. A method according to claim 2 wherein the step of locating includes locating an electrical resistor element on an inner surface of a heat sink plate affixed to the bottom of the electronics package.

7. A method according to claim 6 wherein the electrical resistor element is located on an inner surface of the heat sink plate and is used exclusively for melting the interface member when the electronics package is being mounted to the mounting assembly.

8. A method according to claim 7 wherein the electronics package comprises a transmit/receive (T/R) module for an active aperture of a radar system and wherein the mounting assembly for the T/R module is mounted to a coldplate assembly.

9. A method according to claim 8 and additionally including the step of locating a pair of electrical contacts on an external surface of the T/R module, and connecting the pair of electrical contacts to opposite ends of the electrical resistor element.

10. A method according to claim 9 wherein the member in the interface comprises a thermstrate preform element consisting of a metal carrier having a wax coating on both sides thereof.

11. Apparatus for facilitating the mounting of an electronics package to a mounting assembly which includes a cooling capability and having a thermal interface therebetween including an interface member having a specified melting point which when melted, fills surface imperfections and air gaps between the electronics package and the mounting assembly, comprising:

a heating element located in the electronics package for generating heat sufficient to melt said interface member on demand during initial assembly or replacement; and a pair of electrical contacts located on an outer surface of the electronics package for the connection of an external source of electrical energy to said interface member.

12. The apparatus of claim 11 wherein (he heating element comprises at least one electrical resistance element located on a heat sink member forming part of the electronics package.

13. The apparatus of claim 12 wherein the heat sink member comprises a heat sink plate affixed to the bottom at the electronics package.

14. The apparatus of claim 13 wherein said heat sink plate is in direct contact with the interface member.

15. The apparatus of claim 14 wherein the interface member includes a generally flat carrier element having paraffin-like coatings located on both sides thereof.

16. The apparatus of claim 15 wherein the carrier element is comprised of metallic material.

17. The apparatus of claim 16 wherein the interface member has a thickness of about 0.002 in. and the coatings have a thickness of about 0.001 in.

18. The apparatus of claim 11 wherein the heating element comprises at least one electrical resistor used solely for heating the interface member to the melting point.

19. The apparatus of claim 18 wherein the pair of electrical contacts are located at a rear portion of the electronics package.

20. The apparatus of claim 19 wherein the electronics package comprises a transmit/receive (T/R) module for an active aperture of a radar system.

\* \* \* \* \*